(12) United States Patent
Park et al.

(10) Patent No.: US 8,385,437 B2
(45) Date of Patent: *Feb. 26, 2013

(54) TRANSPORT STREAM GENERATING DEVICE, TRANSMITTING DEVICE, RECEIVING DEVICE, AND A DIGITAL BROADCAST SYSTEM HAVING THE SAME, AND METHOD THEREOF

(75) Inventors: Eui-jun Park, Seoul (KR); Yong-deok Chang, Suwon (KR); Yong-sik Kwon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1161 days.

This patent is subject to a terminal disclaimer.

(21) Appl. No.: 12/254,133

(22) Filed: Oct. 20, 2008

(65) Prior Publication Data

US 2009/0052520 A1   Feb. 26, 2009

Related U.S. Application Data

(63) Continuation of application No. 12/021,521, filed on Jan. 29, 2008, now Pat. No. 8,149,932.

(30) Foreign Application Priority Data

Apr. 20, 2007 (KR) .................................. 2007-38947

(51) Int. Cl.
*H04K 1/10* (2006.01)
(52) U.S. Cl. ..................... 375/260; 375/265
(58) Field of Classification Search ............. 375/260, 375/265, 295, 341
See application file for complete search history.

(56) References Cited

U.S. PATENT DOCUMENTS 8,149,932 B2 * 4/2012 Park et al. ..................... 375/260
2007/0168842 A1 * 7/2007 Jeong et al. ................... 714/786
2008/0253468 A1 * 10/2008 Yu ............................. 375/240.28
2009/0046782 A1 * 2/2009 Park et al. ................. 375/240.23
2011/0044388 A1 * 2/2011 Chen et al. ................. 375/240.25

OTHER PUBLICATIONS

U.S. Appl. No. 12/021,521, filed Jan. 29, 2008, Eui-jun Park et al., Samsung Electronics Co., Ltd.
U.S. Appl. No. 12/254,234, filed Oct. 20, 2008, Eui-jun Park et al., Samsung Electronics Co., Ltd.
U.S. Appl. No. 12/254,141, filed Oct. 20, 2008, Eui-jun Park et al., Samsung Electronics Co., Ltd.
U.S. Appl. No. 12/254,301, filed Oct. 20, 2008, Eui-jun Park et al., Samsung Electronics Co., Ltd.
U.S. Appl. No. 12/254,271, filed Oct. 20, 2008, Eui-jun Park et al., Samsung Electronics Co., Ltd.
U.S. Appl. No. 12/254,292, filed Oct. 20, 2008, Eui-jun Park et al., Samsung Electronics Co., Ltd.
U.S. Appl. No. 12/254,282, filed Oct. 20, 2008, Eui-jun Park et al., Samsung Electronics Co., Ltd.

* cited by examiner

*Primary Examiner* — Emmanuel Bayard
(74) *Attorney, Agent, or Firm* — Sughrue Mion, PLLC

(57) ABSTRACT

A transport stream (TS) generating apparatus, a transmitting apparatus, a receiving apparatus, a digital broadcast system having the above, and a method thereof are provided. The digital broadcast system includes a transport stream (TS) generating apparatus which generates a multi transport stream (TS) by multiplexing a normal stream and a turbo stream having a variable coding rate, a transmitting apparatus which re-constructs the multi TS by processing the turbo stream, and transmits the re-constructed multi TS, and a receiving apparatus which receives the re-constructed multi TS, and decodes the normal stream and the turbo stream respectively, to recover normal data and turbo data. Accordingly, a multi TS, which includes normal stream and a turbo stream of various coding rates, can be transmitted and received efficiently.

20 Claims, 11 Drawing Sheets

TRANSPORT STREAM GENERATING DEVICE, TRANSMITTING DEVICE, RECEIVING DEVICE, AND A DIGITAL BROADCAST SYSTEM HAVING THE SAME, AND METHOD THEREOF

CROSS-REFERENCE TO RELATED APPLICATIONS

This application is a continuation of application Ser. No. 12/021,521 filed on Jan. 29, 2008, now U.S. Pat. No. 8,149,932 which claims the benefit of Korean Application No. 2007-38947 filed Apr. 20, 2007, in the Korean Patent Office, the disclosures of which are incorporated herein by reference.

BACKGROUND OF THE INVENTION

1. Field of the Invention

Aspects of the present invention relate to a transport stream (TS) generating device, a transmitting device, a receiving device, a digital broadcast system having the same, and a method thereof. More particularly, aspects of the present invention relate to a transport stream (TS) generating device, a transmitting device, a receiving device, a digital broadcast system having the same, and a method thereof, in which power consumption of the receiving device of an ATSC VSB system is reduced, and multi TS including turbo stream and normal stream of various coding rates is transmitted and received.

2. Description of the Related Art

An ATSC VSB digital broadcast system adopts a field sync signal in the unit of 312 segments. Therefore, reception degrades in the poor channel such as a Doppler fading channel.

FIG. 1 is a block diagram of a conventional ATSC DTV transmitter and receiver. The ATSC VSB system uses a dual transport stream (TS) which includes normal data and turbo data added to normal data.

Referring to FIG. 1, a digital broadcast transmitter performs error correction encoding of dual TS. Accordingly, the digital broadcast transmitter includes a randomizer 11 to randomize a dual TS, a Reed-Solomon (RS) encoder 12 of concatenated coder type to correct an error generated during the transmission process due to a channel characteristic, an interleaver 13 to interleave RS-encoded data, and a trellis encoder 14 to map, by trellis encoding at the rate of 2/3, the interleaved data into 8-level symbol.

A digital broadcast receiver includes a multiplexer 15 to insert field sync and segment sync into error-corrected data to form the data format illustrated in FIG. 2, and a modulator 16 to add a DC value to a data symbol which has the field sync and segment sync inserted therein, insert a pilot tone, perform pulse-shape and VSB modulation, convert the signal into a signal in RF channel band, and send out the signal.

Accordingly, a digital broadcast transmitter and receiver adopting a dual TS scheme multiplexes normal data and turbo data and inputs the multiplexed data to the randomizer 11.

The input data is randomized at the randomizer 11, and the randomized data is outer-coded at the RS encoder 12 employed as an outer coder. The coded data is rearranged at the interleaver 13.

The interleaved data is inner-coded at the Trellis encoder 14 based on the 12 symbol units, and the inner-coded data is mapped to 8-level symbols. Field sync and segment sync are inserted, and then pilot tones are inserted. The data is converted into RF signal by VSB modulation and forwarded.

Referring to FIG. 1, the digital broadcast receiver includes a tuner (not shown) to convert the RF signal received through a channel into a baseband signal, a demodulator 21 to perform synchronization detection and demodulation of the converted baseband signal, an equalizer 22 to compensate for multipath channel distortion of the demodulated signal, a viterbi decoder 23 to correct the error of the equalized signal and decode into symbol data, a deinterleaver 24 to rearrange the interleaved data from the interleaver 13 of the digital broadcast transmitter, a RS decoder 25 to correct the error, and a derandomizer 26 to derandomize the corrected data from the RS decoder 25 and to output MPEG-2 transport stream.

As explained above, the digital broadcast receiver of FIG. 1 down-converts the RF signal into baseband, by the processing performed in reverse order to that at the digital broadcast transmitter. The digital broadcast receiver then demodulates and equalizes the converted signal, and performs channel decoding to recover the original signal.

FIG. 2 illustrates a VSB data frame of a U.S-oriented digital broadcast (8-VSB) system in which segment sync and field sync are inserted. As illustrated, one frame includes two fields, and one field includes one field sync segment in the first segment, and 312 data segments. One segment of a VSB data frame corresponds to one MPEG-2 packet, and one segment includes four symbol segment sync and 828 data symbols.

Referring to FIG. 2, segment sync and field sync are used at a digital broadcast receiver for synchronization and equalization. Field sync and segment sync are data previously known to a digital broadcast transmitter and a digital broadcast receiver, and used as a reference signal during equalization by the digital broadcast receiver.

Variable coding rates may be applied to turbo data depending on broadcast programs, and the turbo data may be included in dual TS. Accordingly, dual TS may be generated, including normal data and turbo data of various coding rates.

However, a conventional digital broadcast system does not provide transmission and reception of dual TS including normal data and turbo data of various coding rates.

Accordingly, a digital broadcast system is required, which is capable of processing transmission and reception of dual TS including normal data and turbo data of various coding rates.

SUMMARY OF THE INVENTION

Aspects of the present invention provide a transport stream (TS) generating apparatus, a transmitting apparatus, a receiving apparatus, a digital broadcast system having the same, and a method thereof, which is capable of transmitting and receiving multi TS including normal stream and turbo stream of various coding rates, and reducing power consumption of a receiver of an ATSC VSB system.

According to an aspect of the present invention, there is provided a digital broadcast system, which may include a transport stream (TS) generating apparatus which generates a multi transport stream (TS) by multiplexing a normal stream and a turbo stream having a variable coding rate, a transmitting apparatus which re-constructs the multi TS by processing the turbo stream, and transmits the re-constructed multi TS, and a receiving apparatus which receives the re-constructed multi TS, and decodes the normal stream and the turbo stream respectively, to recover normal data and turbo data.

According to an aspect of the present invention, the TS generating apparatus may include a Reed-Solomon (RS) encoder which externally receives a turbo stream, and RS encoder which encodes the turbo stream, a duplicator which prepares a parity insertion region according to the variable coding rate, with respect to the RS-encoded turbo stream, and a multiplexer (MUX) which externally receives a normal stream, and multiplexes the turbo stream processed at the duplicator along with the normal stream, to generate the multi TS.

According to an aspect of the present invention, the transmitting apparatus and the receiving apparatus may perform signal processing of the turbo stream based on a predetermined packet unit, the predetermined packet unit being a multiple of 52 packets.

According to an aspect of the present invention, the transmitting apparatus may include a randomizer which receives the multi TS from the TS generating apparatus and randomizes the received multi TS, a turbo processor which re-constructs the multi TS by detecting the turbo stream from the randomized multi TS and encoding the detected turbo stream, outer-interleaving the encoded turbo stream, deinterleaving in a manner corresponding to the interleaving, and inserting the deinterleaved result into the multi TS, a Reed-Solomon (RS) encoder which RS encodes the re-constructed multi TS, a data interleaver which interleaves the encoded multi TS, a trellis encoder which trellis encodes the interleaved multi TS, a multiplexer (MUX) which carries out multiplexing by adding a synchronous signal to the trellis-encoded multi TS, and a modulator which channel-modulates the multiplexed multi TS, up-converts the channel-modulated multiplexed multi TS into an RF channel band signal, and transmits the resultant signal.

According to an aspect of the present invention, the receiving apparatus may include a demodulator which receives the transmitted multi TS and demodulates the received signal, an equalizer which equalizes the demodulated multi TS, a first processor which processes the normal stream of the equalized multi TS to recover normal data, and a second processor which performs decoding of the turbo stream of the equalized multi TS according to the coding rate of the turbo stream, to recover turbo data.

According to an aspect of the present invention, the second processor may include a turbo decoder which performs turbo-decoding according to the coding rate of the turbo stream of the equalized multi TS, a second derandomizer which derandomizes the multi TS including the turbo-decoded turbo stream, and a turbo stream detector which detects the turbo stream from the derandomized multi TS, to recover the turbo data.

According to another aspect of the present invention, there is provided a transport stream (TS) generating apparatus, which may include a Reed-Solomon (RS) encoder which externally receives a turbo stream, and an RS encoder encodes the turbo stream, a duplicator which prepares a parity insertion region in the RS encoded turbo stream according to a variable coding rate, and a multiplexer (MUX) which externally receives a normal stream, and multiplexes the turbo stream processed at the duplicator along with the normal stream, to generate a multi transport stream (TS).

According to an aspect of the present invention, the duplicator may convert each byte of the turbo stream according to coding rates including 1/2, 1/4, 3/4, 5/6, and 7/8 rates, to prepare the parity insertion region between data bits of the turbo stream.

According to an aspect of the present invention, the TS generating apparatus may further include a randomizer which randomizes the generated multi TS, a turbo processor which re-constructs the multi TS by detecting the turbo stream from the randomized multi TS and encoding the detected turbo stream, outer-interleaving the encoded turbo stream, deinterleaving in a manner corresponding to the interleaving, and inserting the deinterleaved result into the multi TS, and a derandomizer which derandomizes the multi TS processed at the turbo processor.

According to an aspect of the present invention, the turbo processor may include a turbo stream detector which detects the turbo stream from the randomized multi TS, an outer encoder which inserts a parity corresponding to the detected turbo stream into a parity insertion region prepared in the turbo stream, an outer interleaver which outer-interleaves the parity-inserted turbo stream, a data deinterleaver which deinterleaves the interleaved turbo stream, and a turbo stream stuffer which re-constructs the multi TS by inserting the deinterleaved turbo stream into the multi TS.

According to yet another aspect of the present invention, there is provided a transmitting apparatus, which may include a randomizer which receives a multi transport stream (TS), including a mixture of a normal stream and a turbo stream having a variable coding rate, from the TS generating apparatus and randomizes the received multi TS, a turbo processor which re-constructs the multi TS by detecting the turbo stream from the randomized multi TS and encoding the detected turbo stream, outer-interleaving the encoded turbo stream, deinterleaving in a manner corresponding to the interleaving, and inserting the deinterleaved result into the multi TS, a Reed-Solomon (RS) encoder which RS encodes the re-constructed multi TS, a data interleaver which interleaves the encoded multi TS, a trellis encoder which trellis encodes the interleaved multi TS, a multiplexer (MUX) which carries out multiplexing by adding a synchronous signal to the trellis-encoded multi TS, and a modulator which channel-modulates the multiplexed multi TS, up-converts the channel-modulated multiplexed multi TS into RF channel band signal, and transmits the resultant signal.

According to an aspect of the present invention, the transmitting apparatus may further include a parity region generator provided at a front end of the turbo processor, and which generates a parity insertion region with respect to the randomized multi TS, a data interleaver which interleaves the multi TS having the parity insertion region, and a data deinterleaver provided before the turbo processor, and which deinterleaves the re-constructed multi TS.

According to an aspect of the present invention, the RS encoder may carry out encoding by adding a parity corresponding to the multi TS to a parity insertion region generated by the parity region generator.

According to yet another aspect of the present invention, there is provided a receiving apparatus, which may include a demodulator which receives a multi transport stream (TS), including a normal stream and a turbo stream having a variable coding rate, and demodulates the received signal, an equalizer which equalizes the demodulated multi TS, a first processor which processes the normal stream of the equalized multi TS to recover normal data, and a second processor which performs decoding of the turbo stream of the equalized multi TS according to the coding rate of the turbo stream, to recover turbo data.

According to an aspect of the present invention, the second processor may include a turbo decoder which performs turbo-decoding according to the coding rate of the turbo stream of the equalized multi TS, a second derandomizer which derandomizes the multi TS including the turbo-decoded turbo stream, and a turbo stream detector which detects the turbo stream from the derandomized multi TS, to recover the turbo data.

According to an aspect of the present invention, the turbo decoder may include a trellis map decoder which trellis-decodes the turbo stream of the equalized multi TS, an outer deinterleaver which outer-deinterleaves the trellis-decoded turbo stream, an outer map decoder which outer-decodes the deinterleaved turbo stream, and an outer interleaver which interleaves the turbo stream being decoded at the outer map decoder and provides the trellis decoder with the resultant signal, if a soft decision is output from the outer map decoder.

According to yet another aspect of the present invention, there is provided a digital broadcast method, which may include generating a multi transport stream (TS) by multiplexing a normal stream and a turbo stream having a variable coding rate, re-constructing the multi TS by processing the turbo stream, and transmitting the re-constructed multi TS, and receiving the re-constructed multi TS, and decoding the normal stream and the turbo stream respectively, to recover normal data and turbo data.

According to an aspect of the present invention, the generating of the multi TS may include externally receiving a turbo stream, and Reed-Solomon (RS) encoding the turbo stream, preparing a parity insertion region according to the variable coding rate, with respect to the RS-encoded turbo stream, and externally receiving a normal stream, and multiplexing the processed turbo stream along with the normal stream, to generate the multi TS.

According to an aspect of the present invention, the transmitting of the multi TS may include receiving the generated multi TS and randomizing the received multi TS, re-constructing the multi TS by detecting the turbo stream from the randomized multi TS and encoding the detected turbo stream, outer-interleaving the encoded turbo stream, deinterleaving in a manner corresponding to the interleaving, and inserting the deinterleaved result into the multi TS, Reed-Solomon (RS) encoding the re-constructed multi TS, interleaving the encoded multi TS, trellis encoding the interleaved multi TS, multiplexing by adding a synchronous signal to the trellis-encoded multi TS, and channel-modulating the multiplexed multi TS, up-converting the channel-modulated multiplexed multi TS into an RF channel band signal, and transmitting the resultant signal.

According to an aspect of the present invention, the receiving of the multi TS may include receiving the transmitted multi TS and demodulating the received signal, equalizing the demodulated multi TS, first-processing the normal stream of the equalized multi TS to recover normal data, and second processing by decoding the turbo stream of the equalized multi TS according to the coding rate of the turbo stream, to recover turbo data.

According to an aspect of the present invention, the second processing may include turbo-decoding according to the coding rate of the turbo stream of the equalized multi TS, derandomizing the multi TS including the turbo-decoded turbo stream, and detecting the turbo stream from the derandomized multi TS, to recover the turbo data.

According to yet another aspect of the present invention, there is provided a transport stream (TS) generating method, which may include externally receiving a turbo stream, and Reed-Solomon (RS) encoding the turbo stream, preparing a parity insertion region in the RS encoded turbo stream according to a variable coding rate, and externally receiving a normal stream, and multiplexing the processed turbo stream along with the normal stream, to generate a multi transport stream (TS).

According to an aspect of the present invention, the preparing the parity insertion region may include converting each byte of the turbo stream according to coding rates including 1/2, 1/4, 3/4, 5/6, and 7/8 rates, to prepare the parity insertion region between data bits of the turbo stream.

According to an aspect of the present invention, the TS generating method may further include randomizing the generated multi TS, re-constructing the multi TS by detecting the turbo stream from the randomized multi TS and encoding the detected turbo stream, outer-interleaving the encoded turbo stream, deinterleaving in a manner corresponding to the interleaving, and inserting the deinterleaved result into the multi TS, and derandomizing the multi TS having the turbo stream inserted therein.

According to an aspect of the present invention, the re-constructing of the multi TS may include detecting the turbo stream from the randomized multi TS, inserting a parity corresponding to the detected turbo stream into a parity insertion region prepared in the turbo stream, outer-interleaving the parity-inserted turbo stream, deinterleaving the interleaved turbo stream, and re-constructing the multi TS by inserting the deinterleaved turbo stream into the multi TS.

According to yet another aspect of the present invention, there is provided a transmitting method, which may include receiving a multi transport stream (TS), including a mixture of a normal stream and a turbo stream having a variable coding rate, and randomizing the received multi TS, re-constructing the multi TS by detecting the turbo stream from the randomized multi TS and encoding the detected turbo stream, outer-interleaving the encoded turbo stream, deinterleaving in a manner corresponding to the interleaving, and inserting the deinterleaved result into the multi TS, Reed-Solomon (RS) encoding the re-constructed multi TS, interleaving the encoded multi TS, trellis encoding the interleaved multi TS, multiplexing by adding a synchronous signal to the trellis-encoded multi TS, and channel-modulating the multiplexed multi TS, up-converting into RF channel band signal, and transmitting the resultant signal.

According to an aspect of the present invention, the transmitting method may further include generating a parity insertion region with respect to the randomized multi TS, and interleaving the multi TS having the parity insertion region.

According to an aspect of the present invention, the transmitting method may further include deinterleaving the re-constructed multi TS.

According to an aspect of the present invention, the RS encoding may include adding a parity corresponding to the multi TS to the generated parity insertion region.

According to yet another aspect of the present invention, there is provided a receiving method, which may include receiving a multi transport stream (TS), including a normal stream and a turbo stream having a variable coding rate, and demodulating the received signal, equalizing the demodulated multi TS, first processing the normal stream of the equalized multi TS to recover normal data, and second processing decoding of the turbo stream of the equalized multi TS according to the coding rate of the turbo stream, to recover turbo data.

According to an aspect of the present invention, the second processing may include turbo-decoding according to the coding rate of the turbo stream of the equalized multi TS, derandomizing the multi TS including the turbo-decoded turbo stream, and detecting the turbo stream from the derandomized multi TS, to recover the turbo data.

According to an aspect of the present invention, the turbo-decoding may include trellis-decoding the turbo stream of the equalized multi TS, outer-deinterleaving the trellis-decoded turbo stream, outer-decoding the deinterleaved turbo stream, and interleaving the outer-decoded turbo stream and trellis decoding the resultant signal, if a soft decision is output from the outer decoding.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
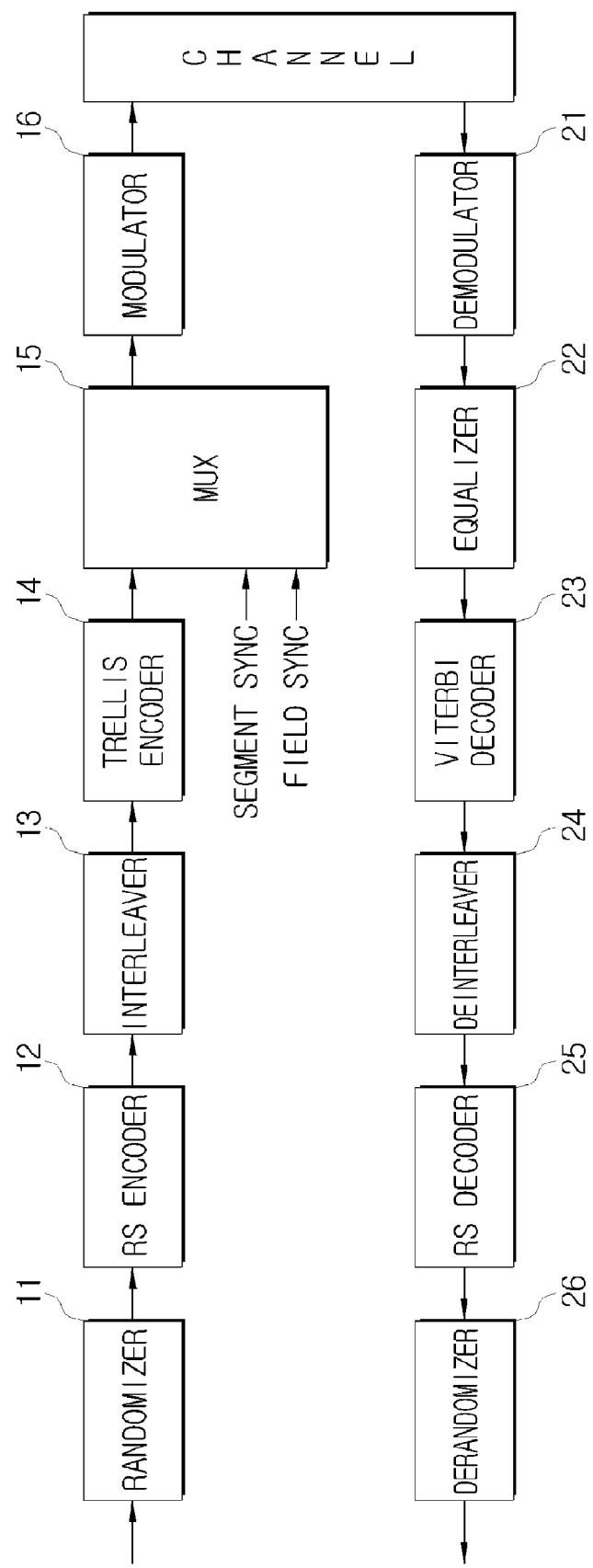
FIG. 1 is a block diagram of a conventional Advanced Television Systems Committee (ATSC) vestigial sideband (VSB) system.
Figure 2:
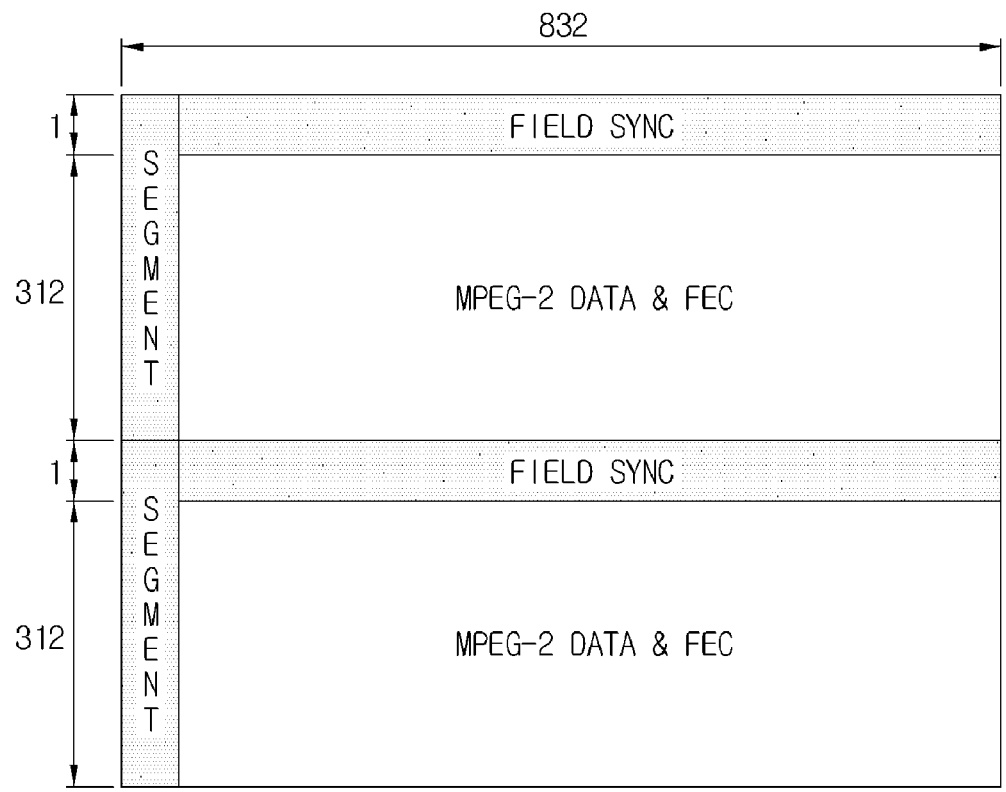
FIG. 2 is a view illustrating an exemplary structure of a conventional ATSC VSB data frame.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
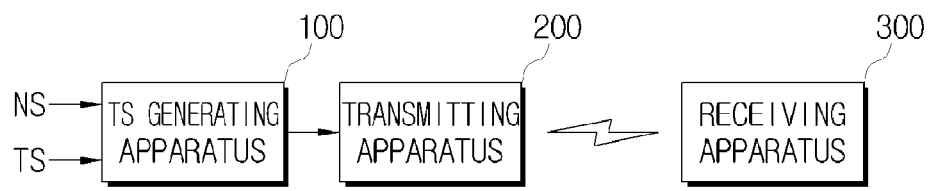
FIG. 3 is a block diagram of a digital broadcast system according to an exemplary embodiment of the present invention.

FIG. 3 is a block diagram of a digital broadcast system according to an exemplary embodiment of the present invention.

Referring to FIG. 3, a digital broadcast system includes a transport stream (TS) generating apparatus 100, a transmitting apparatus 200 and a receiving apparatus 300.

Figure 4:
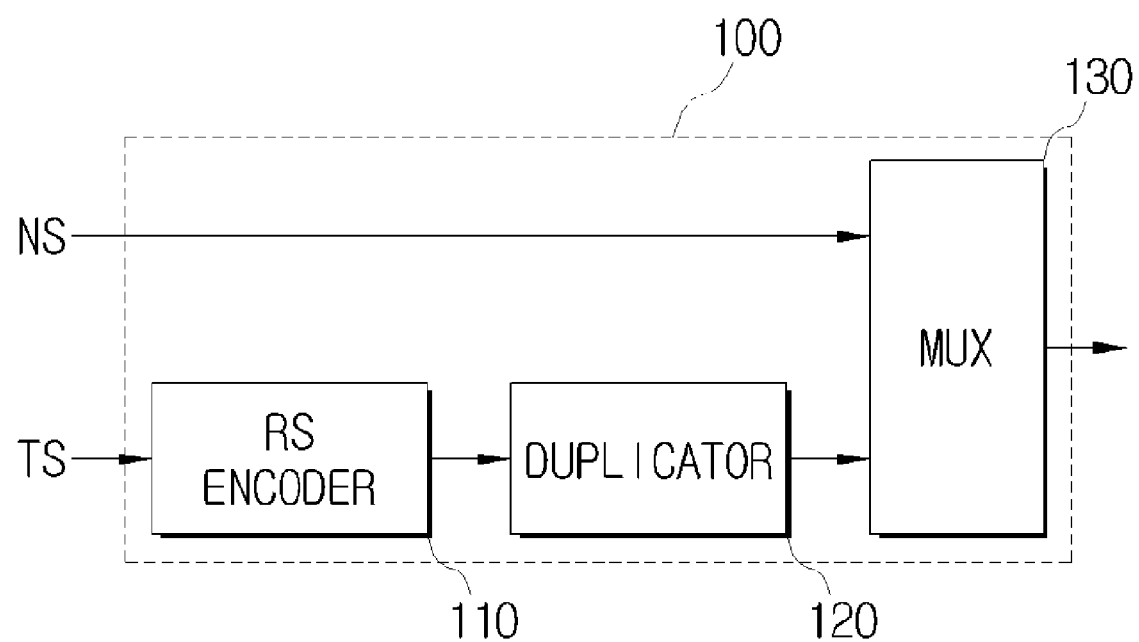
FIG. 4 is a block diagram of a transport stream (TS) generating apparatus of FIG. 3 according to an exemplary embodiment of the present invention.

The TS generating apparatus 100 receives normal stream and turbo stream having variable coding rate, and generates a multi TS by multiplexing the received data. FIG. 4 is a block diagram of an exemplary structure of the TS generating apparatus 100.

Referring to FIG. 4, the multi TS generating apparatus 100 includes a Reed Solomon (RS) encoder 110, a duplicator 120, and a multiplexer (MUX) 130.

The RS encoder 110 receives turbo stream, adds parities, encodes the parity-added stream, and provides the duplicator 120 with the signal.

The RS encoder 110 removes synchronous signal from the turbo stream, computes parities regarding the turbo stream region, and adds 20-byte long parities.

As a result, one packet of the final form of the turbo stream after the encoding includes a total of 207 bytes. Three out of 207 bytes are allocated to packet identity (PID), 184 are allocated to turbo data, and 20 are allocated to parities.

The duplicator 120 prepares a parity insertion region in the encoded turbo stream, according to the variable coding rates.

Accordingly, the duplicator 120 prepares a parity insertion region between data bits of the turbo stream, by changing each byte of the turbo stream according to various coding rates such as 1/2, 1/4, 3/4, 5/6, or 7/8.

The above process of preparing a parity insertion region will be explained in greater detail below. Each byte of the turbo stream, which is the basic unit of the turbo stream, is divided into one to seven bytes according to coding rates. A part of one-byte bit value and null data (for example, 0) are then stuffed in each byte. The region where the null data is stuffed, becomes a parity insertion region.

The operation of the duplicator 120 will be explained in greater detail below.

If bits included in one byte are represented as 'a, b, c, d, e, f, g, h' from the most significant bit (MSB), and if a signal is input in the same order, an output from the duplicator 120 may be doubled by 1/2 coding rate and represented as 'a, a, b, b, c, c, d, d, e, e, f, f, g, g, h, h.'

Starting from the MSB, total two bytes, including 1 byte represented as 'a, a, b, b, c, c, d, d' and another 1 byte represented as 'e, e, f, f, g, g, h, h' are sequentially output.

If the input is quadrupled by applying 1/4 coding rate, the output of the duplicator 120 may be represented as 'a, a, a, a, b, b, b, b, c, c, c, c, d, d, d, d, e, e, e, e, f, f, f, f, g, g, g, g, h, h, h, h.' Accordingly, four bytes are output.

The duplicator 120 may not necessarily copy the input bits. Instead, the duplicator 120 may insert other value such as null data except the locations previously designated.

For example, if the duplicator 120 doubles the input according to 1/2 coding rate, the first bits of the pairs of consecutive bits may be maintained, while the second bits of the pairs are replaced by another value (x). Accordingly, 'a, x, b, x, c, x, . . . ' may be output, instead of 'a, a, b, b, c, c, . . . .'

The size of input may be changed by other coding rates in the same manner explained above.

Meanwhile, a data interleaver (not shown) may be inserted between the RS encoder 110 and the duplicator 120.

The MUX 130 prepares an adaptation field in each packet of the multi TS. The adaptation field is provided to insert turbo stream or other data.

In particular, the adaptation field includes an adaptation field header, and an insertion area. The insertion area is provided to insert other data.

A private data flag may be used as an insertion area. The adaptation field header represents the length of an adaptation field and a flag within the adaptation field. The adaptation field header is the area corresponding to the two bytes following the PID.

Accordingly, the MUX 130 may prepare an area to insert the turbo stream in a stuffing region of the adaptation field of the multi TS. Alternatively, the turbo stream may be inserted in the private data flag of the adaptation field.

The adaptation field may be used as an option field in which various packet information is written. The packet information may include program clock reference (PCR) which is used for synchronization with the demodulator of a receiver, original program clock reference (OPCR) which is used for program recording, reservation and playback by the receiver, splice countdown, which are the consecutive numbers of macro blocks including four circuit blocks, one Cr block, and one Cb block, transport private data length which is the length of the text data of text broadcast, and adaptation field extension length.

The area where the turbo stream is written, and the option field are arranged in a non-overlapping manner.

Meanwhile, in order to transmit turbo streams of various coding rates and various data rates, the MUX 130 may generate multi TS having different coding rates based on the turbo unit. The 'turbo unit' is desirably based on the multiples of 52 packets.

Figure 5:
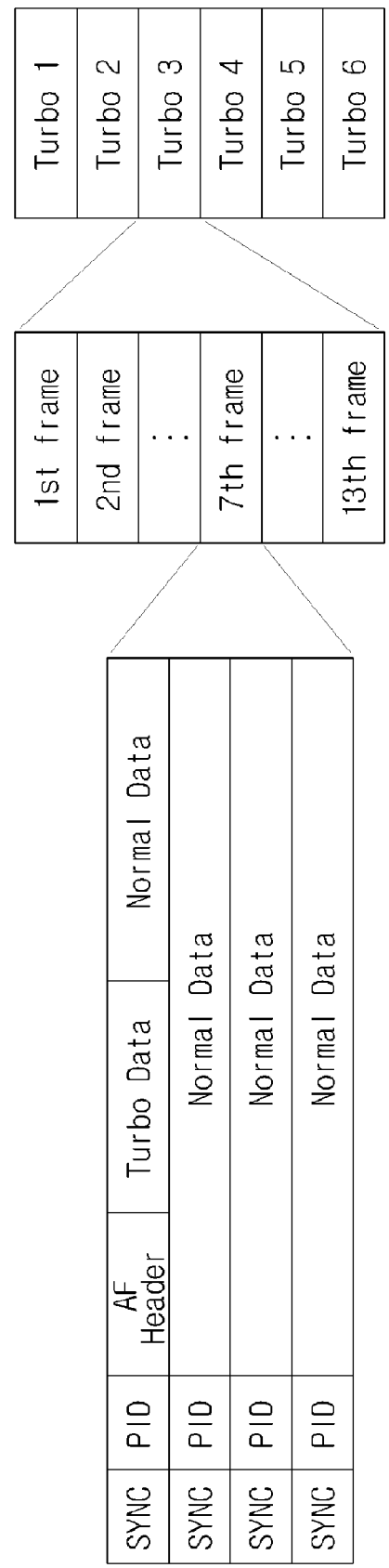
FIG. 5 is a view illustrating the structure of a multi transport stream (TS) according to an exemplary embodiment of the present invention.

FIG. 5 illustrates the structure of a multi TS being output through the MUX 130 of FIG. 4. Referring to FIG. 5, a VSB data frame includes 312 packets. For example, a VSB data frame includes 6 turbo units, each turbo unit including 52 packets.

More specifically, one multi TS packet including a mixture of turbo stream and normal stream form one frame with three multi TS packets including normal stream only. Therefore, thirteen frames represent one turbo unit.

In other words, 52 packets constitute one turbo unit, according to which turbo stream is inserted alternately, in every fourth packet. The amount of turbo stream being inserted influences the data rate of the normal stream and the turbo stream.

Each of the six turbo units may include turbo stream of varying coding rates being inserted therein.

For example, 'turbo 1' denotes data packet of program 1, which includes 1/2 rate-applied turbo stream. 'Turbo 2' denotes data packet of program 2, which includes 1/4 rate-applied turbo stream.

Accordingly, 'turbo 3' and 'turbo 4' denote data packets of program 3, which include 1/2 rate-applied turbo stream. 'Turbo 5' and 'turbo 6' denote data packet of program 4, which includes 1/4 rate-applied turbo stream.

The above coding information and program information may be inserted in every field, or inserted differently in each field. That is, which coding information and program information are inserted in each field, may be determined according to user design. The coding and program information is used at the receiving side.

The coding information, including the coding rate applied to the respective turbo streams, may be inserted in the synchronous signal of the multi TS. Alternatively, the coding information may be inserted in a part of data area of each packet. The ways to insert the coding information may be varied according to the specification by a designer, and not to be limited to certain examples.

Accordingly, a transmitting apparatus 200 is capable of performing encoding according to the coding rate indicated by the coding information.

If multi TS of the same construction is inserted in every VSB data frame, the data rate of each stream determines the amount of coding rate and amount of turbo stream being inserted.

Figure 6:
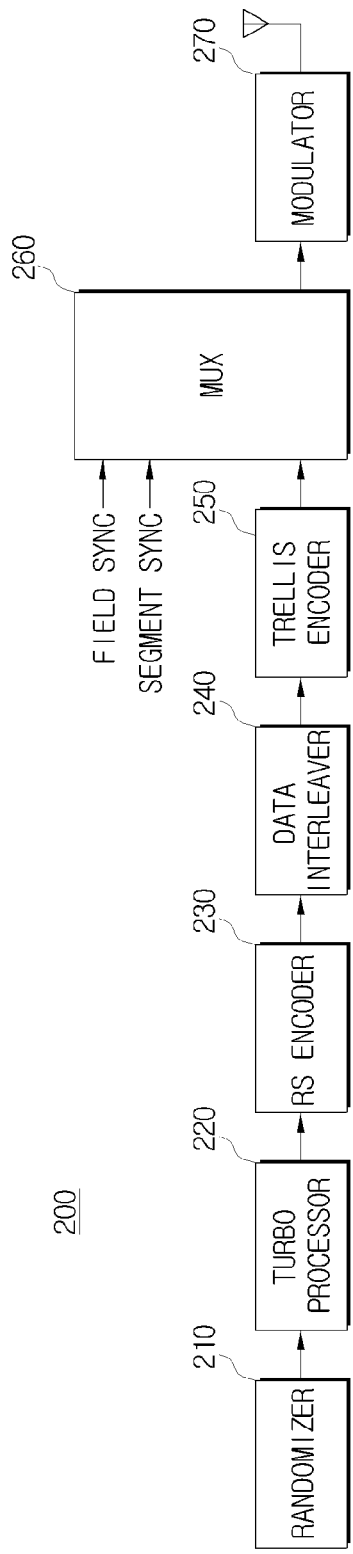
FIG. 6 is a block diagram of a transmitting apparatus of FIG. 3 according to an exemplary embodiment of the present invention.

The transmitting apparatus of FIG. 3 may be constructed as illustrated in FIG. 6.

Referring to FIG. 6, the transmitting apparatus 200 includes a randomizer 210, a turbo processor 220, an RS encoder 230, a data interleaver 240, a trellis encoder 250, a MUX 270 and a modulator 270.

The randomizer 210 randomizes the multi TS being received from the TS generating apparatus 100.

The turbo processor 220 exclusively detects turbo stream of the randomized multi TS, and robust-processes the detected turbo stream by encoding and interleaving.

The robust-processed turbo stream is deinterleaved, and inserted in the multi TS to re-construct a multi TS. The exemplary structure of the turbo processor 220 is illustrated in FIG. 7.

Figure 7:
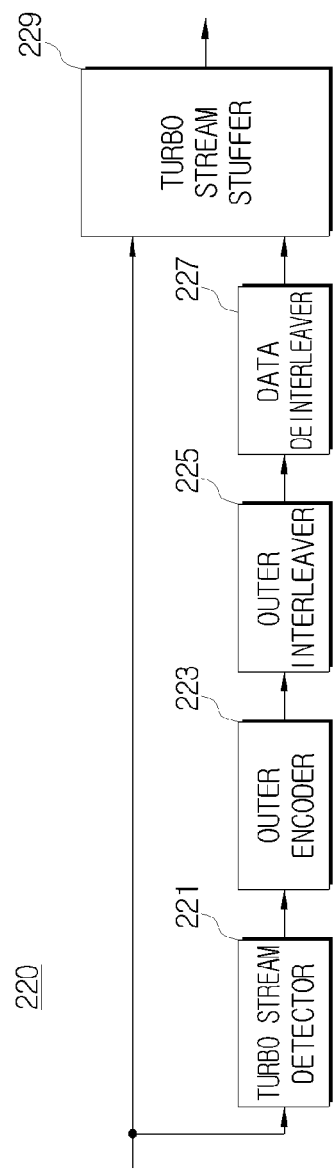
FIG. 7 is a block diagram of the turbo processor of FIG. 6.

Referring to FIG. 7, the turbo processor 220 includes a turbo stream detector 221, an outer encoder 223, an outer interleaver 225, a data deinterleaver 227, and a turbo stream stuffer 229.

The turbo stream detector 221 exclusively detects the turbo stream from the randomized multi TS.

The outer encoder 223 encodes the detected turbo stream.

That is, the encoding includes the process of convolution-encoding the turbo stream, and inserting the encoded result in the parity insertion region provided in the turbo stream. The encoding may be performed based on the coding information inserted in the synchronous signal or the data area.

The outer interleaver 225 outer-interleaves the turbo stream encoded in the turbo units, in which each turbo unit includes 52 packets.

The outer interleaver 225 interleaves according to a predetermined interleaving rule. For example, if ABCD is input in sequence, under the interleaving rule of {2, 1, 3, 0}, the data is interleaved to DBAC and output. The interleaving rule may be varied according to the specification by a designer.

The outer interleaver 225 has a similar structure to that of the outer deinterleaver 420 provided in the turbo decoder 341 of the receiving apparatus 300. The term 'outer interleaving' includes interleaving process required for the turbo-decoding of turbo stream.

The data deinterleaver 227 deinterleaves the interleaved turbo stream. The data deinterleaver 227 processes turbo stream in reverse manner with respect to the data interleaver 240 of FIG. 6.

The data deinterleaver 227 may also perform position exchange between turbo streams, and delay of turbo streams.

The deinterleaving of the data performed at the data deinterleaver 227 is such that the multi TS being interleaved at the data interleaver 240 of FIG. 6 has the structure in which the turbo stream is combined, enabling processing of turbo stream in turbo units as illustrated in FIG. 5.

Because turbo stream is processed in turbo units, processing time of the turbo decoder is reduced, and power consumption is reduced.

For example, if a user wants to watch program 2 only, turbo 2 is exclusively operated, without operating the other parts to process all the other data. As a result, power consumption is reduced.

The turbo stream stuffer 229 inserts deinterleaved turbo stream in multi TS, to re-construct a multi TS. Accordingly, only the turbo stream can be robust-processed, without having to process the entire multi TS.

Although not illustrated in the drawings, a byte-symbol converter (not shown), and a symbol-byte converter (not shown) may be additionally provided at a front end and a back end of the turbo processor.

The byte-symbol converter (not shown) and the symbol-byte converter (not shown) convert the multi TS from byte unit to symbol unit, or vice versa. The byte-to-symbol and symbol-to-byte conversion can be referred in table D5.2 of the American Television Systems Committee (ATSC) digital television (DTV) standards (A/53).

Referring back to FIG. 6, the RS encoder 230 RS-encodes the processed multi TS.

The data interleaver 240 interleaves the encoded multi TS. That is, the data interleaver 240 interleaves the multi TS according to interleaving rule under VSB standards.

The trellis encoder 250 trellis-encodes the interleaved multi TS.

The MUX 260 multiplexes the trellis-encoded multi TS, by adding segment sync and field sync.

The modulator 270 channel modulates the multiplexed multi TS, up-converts the channel modulated multiplexed multi TS into RF channel band signal, and transmits the resultant signal to a receiving apparatus. The multi TS being transmitted from the modulator 270 is received at the receiving apparatus 300 through a channel.

Although not illustrated in the drawings, the modulator 270 may further include a pilot inserter (not shown), a pre-equalizer (not shown), a VSB modulator (not shown), and a RF modulator (not shown).

The pilot inserter inserts a pilot, by adding a DC value to synchronous signal-added multi TS.

The pre-equalizer equalizes the pilot-inserted multi TS, to minimize inter-symbol interference.

The VSB modulator VSB modulates the equalized multi TS.

The RF modulator modulates the VSB-modulated multi TS into the RF channel band signal, and transmits the signal.

Although the transmitting apparatus 200 according to the exemplary embodiment of the present invention has the turbo processor 220 provided in back of the randomizer 210, the position of the randomizer 210 and the turbo processor 220 may be exchanged.

Figure 10:
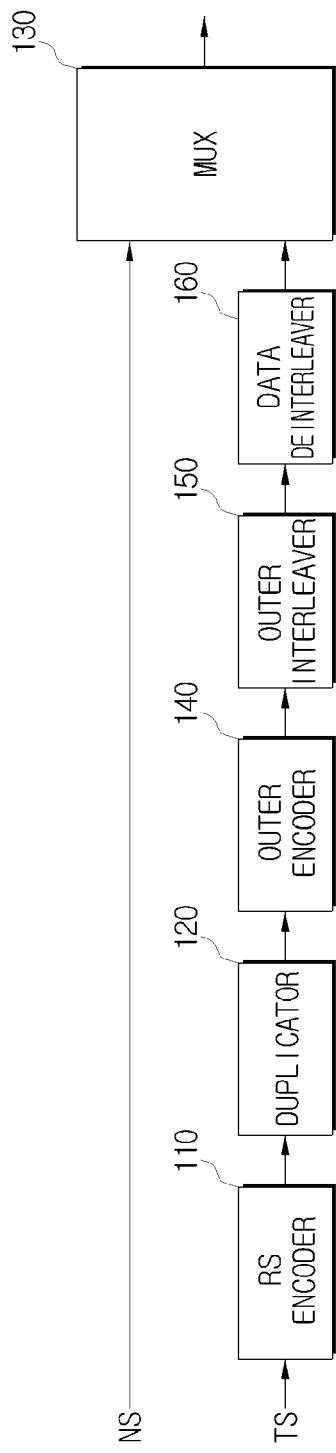
FIG. 10 is a block diagram of a transport stream (TS) generating apparatus according to another exemplary embodiment of the present invention.
Figure 12:
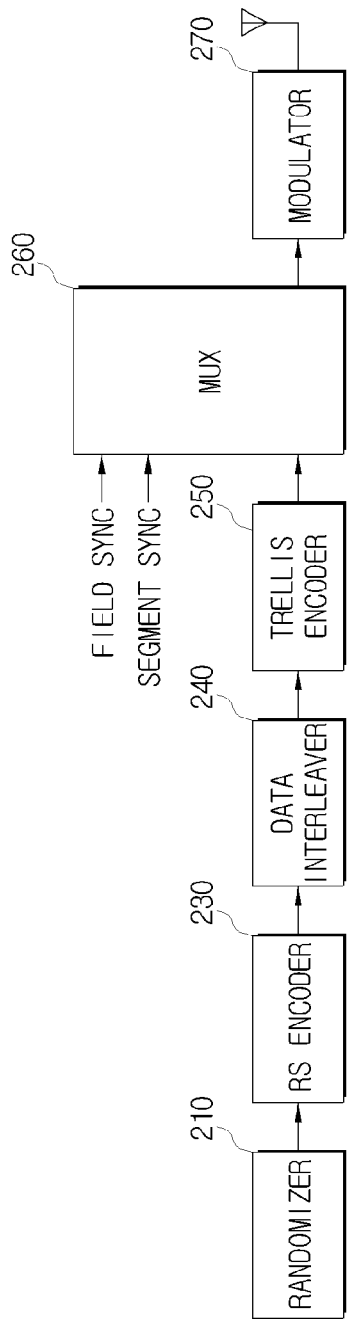
FIG. 12 is a block diagram of a transmitting apparatus according to yet another exemplary embodiment of the present invention.

In the event that the TS generating apparatus of FIG. 10 is combined with the transmitting apparatus of FIG. 12, the randomizer 210 and the turbo processor 220 exchange positions.

Figure 8:
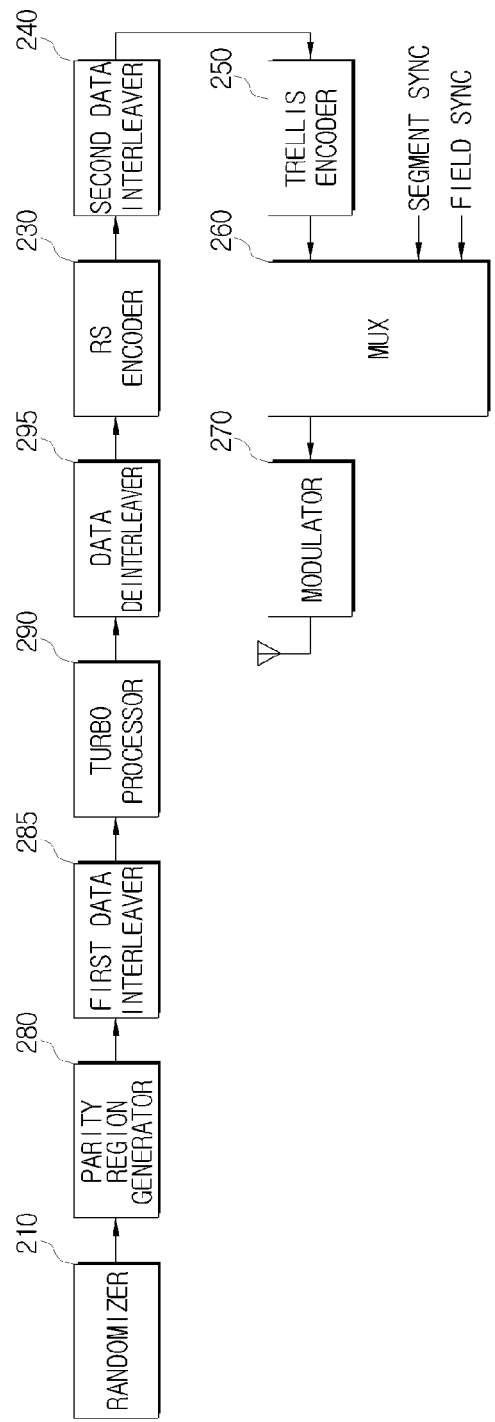
FIG. 8 is a block diagram of a transmitting apparatus according to another exemplary embodiment of the present invention.

FIG. 8 is a block diagram of a transmitting apparatus according to another exemplary embodiment of the present invention.

Referring to FIG. 8, the transmitting apparatus includes a randomizer 210, a parity region generation unit 280, a first data interleaver 285, a turbo processor 290, a data deinterleaver 295, an RS encoder 230, a second data interleaver 240, a trellis encoder 250, a MUX 260 and a modulator 270.

The randomizer 210 randomizes a multi TS being received from a TS generating apparatus 100 and provides the parity region generator 280 with the resultant signal.

The parity region generator 280 prepares a region for parity insertion, in the multi TS including normal stream and turbo stream. Accordingly, a parity bit, being computed from the multi TS, is inserted, that is, written in the parity insertion region.

The first data interleaver 285 interleaves the multi TS being processed at the parity region generator 280.

The turbo processor 290 carries out turbo encoding by demultiplexing the interleaved multi TS, detecting the turbo stream to encode the stream in turbo units, and multiplexing the turbo stream with the multi TS.

Figure 9:
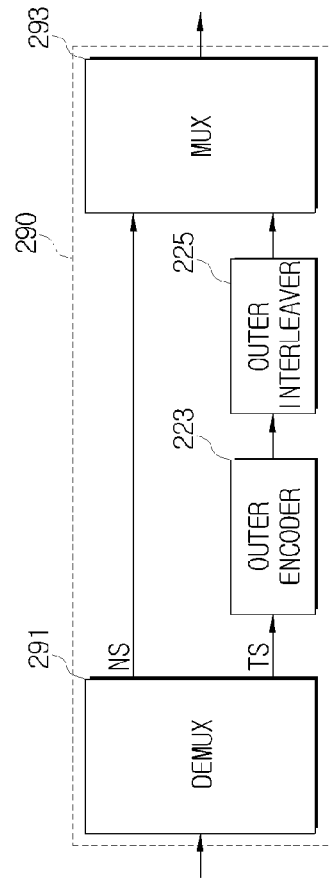
FIG. 9 is a block diagram of the turbo processor of FIG. 8.

The exemplary structure of the turbo processor 290 is illustrated in FIG. 9. Referring to FIG. 9, the turbo processor 290 includes a DEMUX 291, an outer encoder 223, an outer interleaver 225, and a MUX 293.

The DEMUX 291 detects turbo stream by demultiplexing the interleaved multi TS.

The outer encoder 23 encodes the turbo stream in turbo units, by computing parities of the detected turbo stream, and inserting the parities in the parity insertion region of the turbo stream. The outer encoder 223 may perform encoding based on the coding information.

The outer interleaver 225 outer-interleaves the encoded turbo stream.

The MUX 293 multiplexes the interleaved turbo stream and the multi TS. As a result, the turbo stream is robust-processed.

The turbo processor 290 may be replaced with the turbo processor 220 illustrated in FIG. 7. In this case, because the turbo stream of the multi TS being distributed by the second data interleaver 240 combines with other turbo streams, the operation based on turbo units is possible.

Referring back to FIG. 8, the data deinterleaver 295 deinterleaves the multi TS being output from the turbo processor 290.

The RS encoder 230 carries out encoding, by adding parities to the multi TS being provided by the data deinterleaver 295. In particular, the RS encoder 230 inserts parities computed based on the multi TS, into the parity insertion region prepared by the parity region generator 280.

The second data interleaver 240 interleaves the parity-added multi TS.

The trellis encoder 250 trellis encodes the multi TS being interleaved by the second data interleaver 240.

The MUX 260 carries out multiplexing, by adding segment sync and field sync to the trellis-encoded multi TS.

The modulator 270 channel modulate the multiplexed multi TS and up-converts into RF band signal.

FIG. 10 is a block diagram of a TS generating apparatus according to another exemplary embodiment of the present invention.

Referring to FIG. 10, the TS generating apparatus includes a RS encoder 110, a duplicator 120, an outer encoder 140, an outer interleaver 150, a data deinterleaver 160, and a MUX 130.

Meanwhile, the outer encoder 140, the outer interleaver 150, and the data deinterleaver 160 may operate in the same manner as the outer encoder 223, the outer interleaver 225 and the data deinterleaver 227 of FIG. 7. The explanation regarding overlapping elements or operations will be omitted for the sake of brevity.

The RS encoder 110 removes synchronous signal from the turbo stream, computes parities of the turbo data region, and adds 20-byte long parities.

The duplicator 120 prepares a parity insertion region in the encoded turbo stream according to the coding rate.

The outer encoder 140 carries out encoding, by convolution-encoding the turbo stream, and inserting the encoded value into the parity insertion region prepared by the duplicator 120.

The outer interleaver 150 outer-interleaves the encoded turbo stream.

The data deinterleaver 160 deinterleaves the interleaved turbo stream.

The MUX 130 multiplexes a separately incoming normal stream and the turbo stream which is processed at the duplicator 120. As a result, a multi TS including mixture of normal stream and turbo stream, is generated.

Meanwhile, the MUX 130 may prepare a region for inserting turbo stream, in a stuffing region included in the adaptation field of each packet of the multi TS.

The MUX 130 may generate a multi TS including turbo stream including each turbo unit varying according to different coding rates, in order to transmit turbo stream having various coding rates and various data rates. The turbo unit may correspond to multiples of 52 packets.

Figure 11:
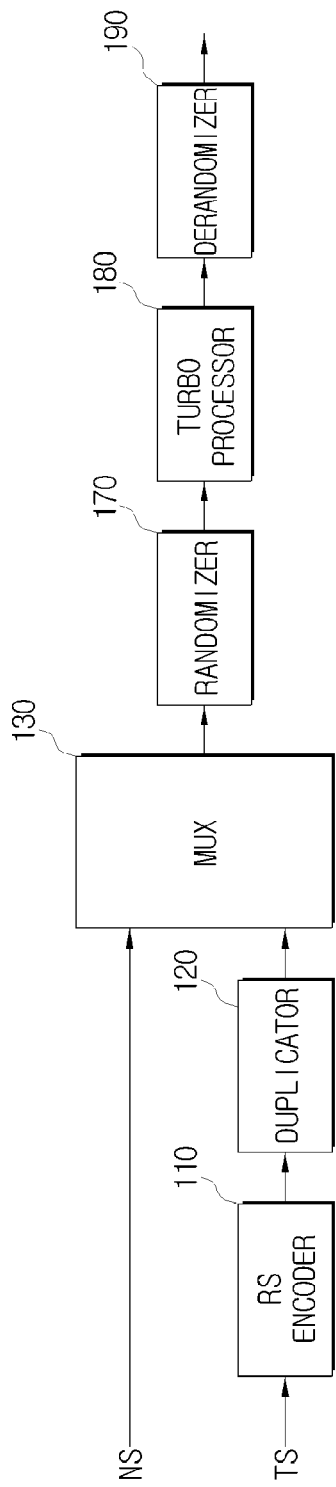
FIG. 11 is a block diagram of a transport stream (TS) generating apparatus according to yet another exemplary embodiment of the present invention.

FIG. 11 is a block diagram of a TS generating apparatus according to yet another exemplary embodiment of the present invention.

Referring to FIG. 11, the TS generating apparatus includes an RS encoder 110, a duplicator 120, a MUX 130, a randomizer 170, a turbo processor 180 and a derandomizer 190. The RS encoder 110, the duplicator 120 and the MUX 130 may operate in the same manner as the RS encoder 110, the duplicator 120, and the MUX 130 illustrated in FIG. 4. The explanation regarding overlapping elements or operations will be omitted for the sake of brevity.

The randomizer 170 randomizes the generated multi TS.

The turbo processor 180 performs robust processing, by exclusively detecting turbo stream from the randomized multi TS, and encoding and interleaving the detected turbo stream. The robust turbo stream is deinterleaved and inserted into the multi TS. As a result, a multi TS is re-constructed.

The turbo processor 180 may be constructed in the manner as illustrated in FIG. 7.

The derandomizer 190 derandomizes the re-constructed multi TS.

FIG. 12 is a block diagram of a transmitting apparatus according to yet another exemplary embodiment of the present invention.

Referring to FIG. 12, the transmitting apparatus according to yet another exemplary embodiment of the present invention may include a randomizer 210, an RS encoder 230, a data interleaver 240, a trellis encoder 250, a MUX 260 and a modulator 270.

The transmitting apparatus receives robust multi TS from the TS generating apparatus of FIGS. 10 and 11, carries out operations including randomizing, RS encoding data, interleaving, and trellis encoding, multiplexes by adding segment sync and field sync, performs channel modulation and transmits the resultant signal. The construction of this particular exemplary embodiment is similar to that illustrated in FIG. 8. Therefore, the explanation regarding the overlapping elements or operations will be omitted for the sake of brevity.

Figure 13:
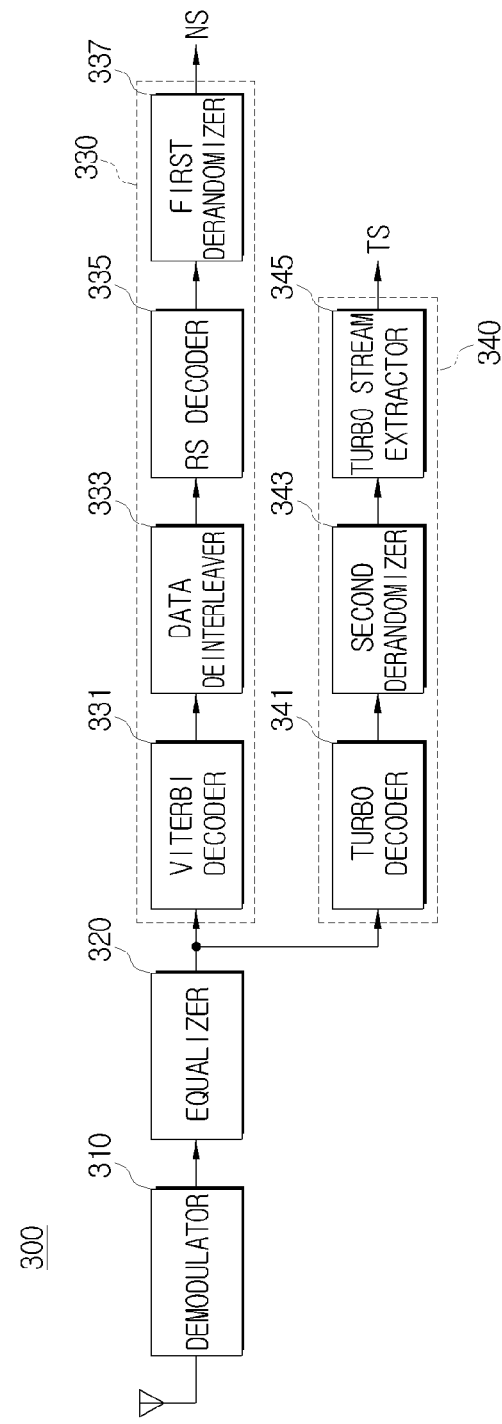
FIG. 13 is a block diagram of the receiving apparatus of FIG. 3 according to an exemplary embodiment of the present invention.

FIG. 13 is a block diagram of the receiving apparatus of FIG. 3 according to the exemplary embodiment of the present invention.

Referring to FIG. 13, the receiving apparatus 300 includes a demodulator 310, an equalizer 320, a first processor 330, and a second processor 340.

If a multi TS is modulated into RF signal format and received via an antenna, the demodulator 310 detects synchronization according to a synchronous signal added to the baseband signal of the received multi TS and performs demodulation.

The equalizer 320 equalizes the demodulated multi TS, and compensates for multi-path channel distortion. The multi TS being equalized by the equalizer 320 is provided to the first processor 330 and the second processor 340.

The first processor 330 processes normal stream of the multi TS to recover normal data.

The first processor 330 includes a viterbi decoder 331, a data deinterleaver 333, an RS decoder 335, and a first derandomizer 337.

The viterbi decoder 331 performs error correction of normal stream of the equalized multi TS, performs decryption of the error-corrected symbol, and outputs symbol packet.

The data deinterleaver 333 deinterleaves the decrypted packet, and rearranges the distributed packets.

The RS decoder 335 corrects an error, by RS decoding the deinterleaved normal stream packets.

The first derandomizer 337 derandomizes the RS decoded normal stream packets, to recover the normal data.

Meanwhile, the second processor 340 processes the turbo stream of the multi TS, to recover the turbo data.

The second processor 340 includes a turbo decoder 341, a second derandomizer 343 and a turbo stream extractor 345.

The turbo decoder 341 selectively performs turbo-decoding, exclusively for the turbo stream of the equalized multi TS. The turbo-decoding involves decoding of turbo stream.

The turbo decoder 341 may perform turbo-decoding, by detecting turbo stream from a part of the packet adaptation field or the entire packet adaption field of the multi TS.

The turbo decoder 341 may exclusively decode the data as desired by the user, according to the coding information.

Because turbo stream is turbo-encoded and deinterleaved in turbo units applying various coding rates, turbo-decoding in turbo units is performed easily.

Exclusive data decoding according to a user selection is possible. By exclusively decoding the data desired by a user, a part of the incoming turbo stream, or the entire turbo stream may be selectively turbo-decoded.

The second randomizer 343 derandomizes the turbo-decoded multi TS.

The turbo stream extractor 345 recovers turbo data, by detecting turbo stream from the derandomized multi TS.

In particular, the turbo stream extractor 345 extracts turbo stream, collects information regarding the turbo stream only, passes the RS decoder (not shown), and recovers the turbo data.

Figure 14:
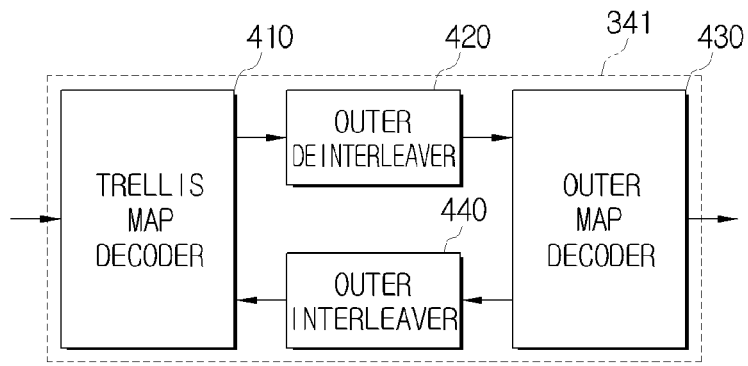
FIG. 14 is a block diagram of the turbo decoder of FIG. 13.

FIG. 14 is a block diagram of turbo decoder 341.

Referring to FIG. 14, the turbo decoder 341 includes a trellis map decoder 410, an outer deinterleaver 420, an outer map decoder 430, and an outer interleaver 440.

The trellis map decoder 410 trellis decodes the turbo stream of the equalized multi TS, and provides the outer deinterleaver 420 with the resultant signal. Exclusive decoding of data of certain channel based on the coding information is possible according to user selection.

Accordingly, by undergoing the deinterleaving process at the turbo processor 220 of the transmitting apparatus 200, illustrated in FIG. 6, turbo streams of later distributed multi TS can be combined with each other, and processing of turbo streams in turbo units is enabled.

The outer deinterleaver 420 deinterleaves the trellis-decoded turbo stream.

The outer map decoder 430 may convolution-decode the deinterleaved turbo stream. The outer map decoder 430 outputs soft decision output and hard decision output according to the result of the convolution-decoding. The soft and hard decisions are based on the metrics of turbo stream.

For example, if the turbo stream has a metric of "0.8", soft decision "0.8" is output, and if the turbo stream has a metric of "1", hard decision "1" is output.

The hard decision output from the outer map decoder 430 is provided to the second derandomizer 343, illustrated in FIG. 13. In this case, the hard decision output refers to the turbo stream.

Meanwhile, if a soft decision is output from the outer map decoder 430, the outer interleaver 440 interleaves the turbo stream and provides the trellis map decoder 410 with the resultant signal.

The trellis map decoder 410 re-performs trellis decoding of the interleaved turbo stream, and provides the outer deinterleaver 420 with the resultant signal. The outer deinterleaver 420 outer-deinterleaves the signal again, and provides the outer map decoder 430 with the resultant signal.

The operations of the trellis map decoder 410, the outer deinterleaver 420, and the outer interleaver 440 may be repeated until a hard decision output is made. As a result, a reliable decoding value can be obtained.

Figure 15:
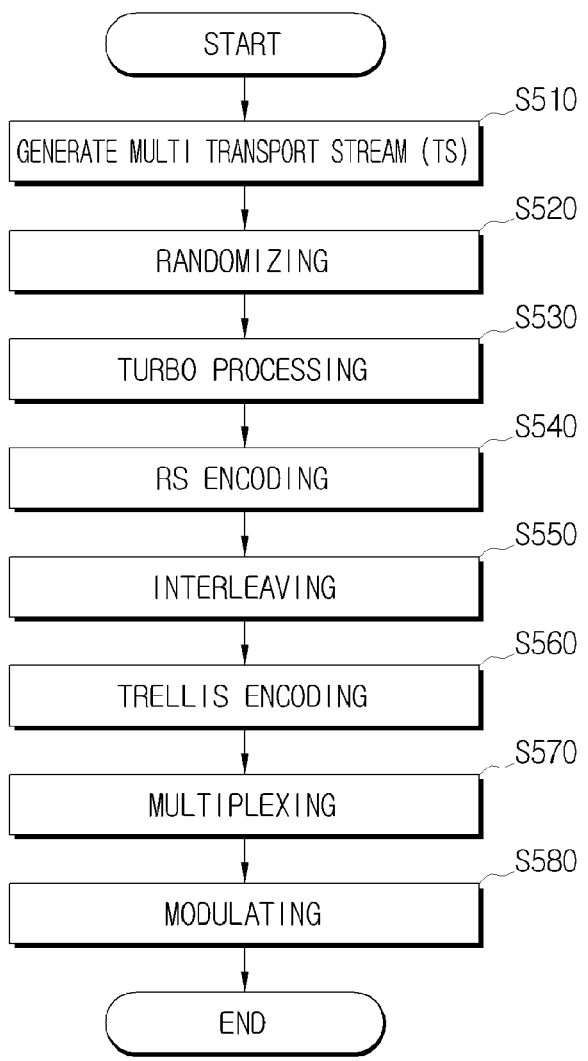
FIG. 15 is a flowchart illustrating the process of transmitting multi TS according to an exemplary embodiment of the present invention.

FIG. 15 is a flowchart illustrating the process of transmitting a multi TS according to an exemplary embodiment of the present invention.

Referring to FIG. 15, a multi TS including the mixture of normal stream and turbo stream having variable coding rate, is generated in operation S510. In particular, a parity insertion region is prepared in the turbo stream according to various coding rates, and an adaptation field is prepared in the normal stream. The two streams are multiplexed, and as a result, a multi TS is generated.

Next, the generated multi TS is randomized in operation S520, and turbo-processed in operation S530. The turbo processing will be explained in detail below, with reference to FIG. 16.

If turbo processing is completed, the multi TS is RS encoded in operation S540, and interleaved in operation S550.

The interleaved multi TS is trellis encoded, and the trellis encoded multi TS is added with segment sync and field sync, and then multiplexed in operation S570.

Next, channel modulation is carried out in operation S580. The above operations have been already explained in detail above, and therefore, detailed explanations thereof will be omitted for the sake of brevity.

Figure 16:
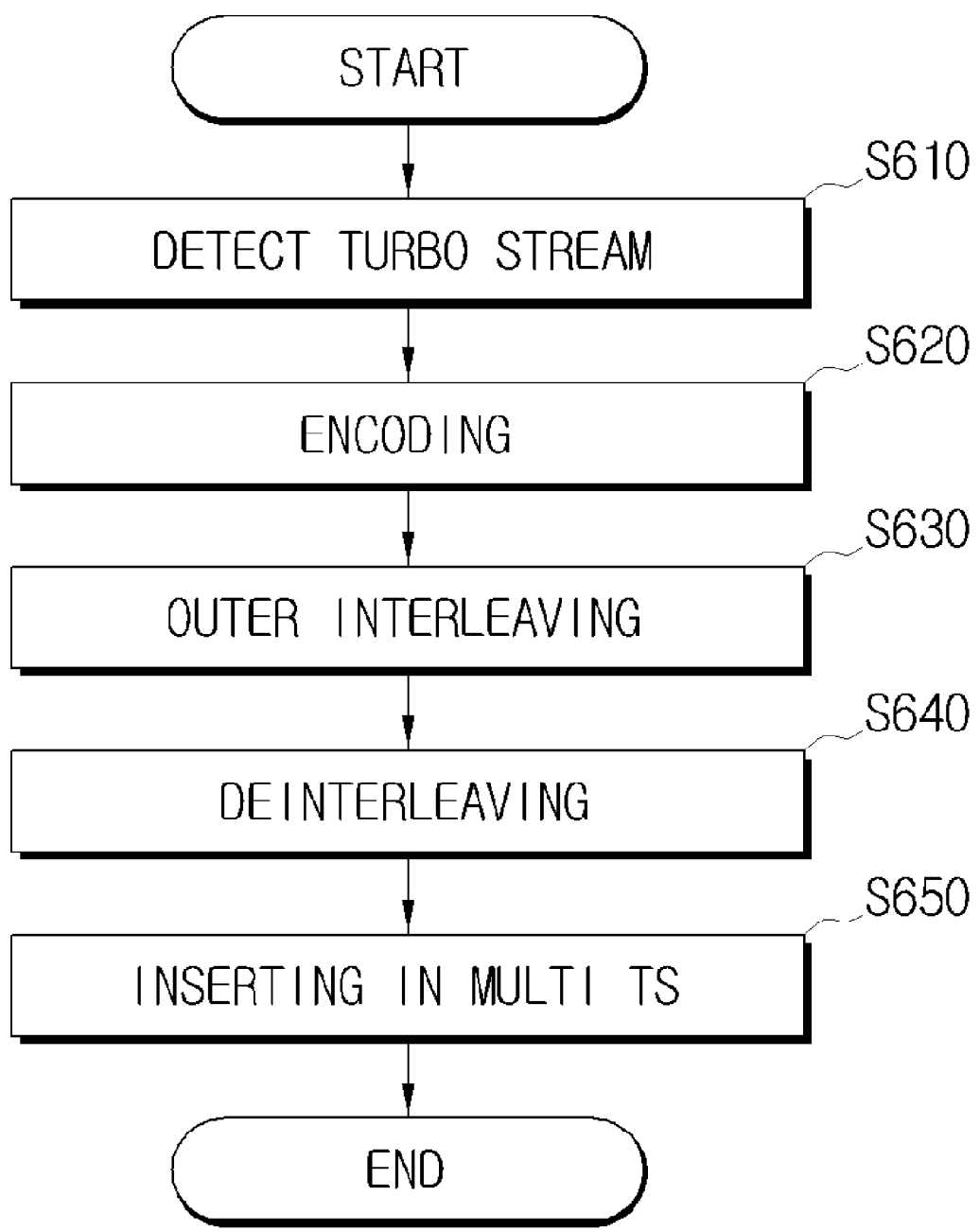
FIG. 16 is a flowchart illustrating the turbo processing according to an exemplary embodiment of the present invention.

FIG. 16 is a flowchart illustrating the turbo processing according to an exemplary embodiment of the present invention.

Referring to FIG. 16, a multi TS is received, and turbo stream is detected exclusively in operation S610. The detected turbo stream is encoded in turbo units in operation S620. The encoding includes convolution-encoding based on the coding information, and inserting the encoded value in the parity insertion region prepared in the turbo stream.

If encoding is completed, the encoded turbo stream is outer-interleaved in operation S630, and the interleaved turbo stream is deinterleaved in operation S640.

Accordingly, in the later process of interleaving the multi TS, turbo streams of the multi TS can be concentrated with each other. That is, from the viewpoint of receiving apparatus, it is easy to recover turbo stream selectively, because the turbo streams are not distributed but combined with each other. As a result, power consumption at the receiving apparatus is reduced.

For example, if a user wants to view program 2 only, he may operate turbo 2 only, and not operate the other data, thereby saving power consumption.

The turbo stream is inserted back into the multi TS, so that the multi TS is re-constructed in operation S650.

Figure 17:
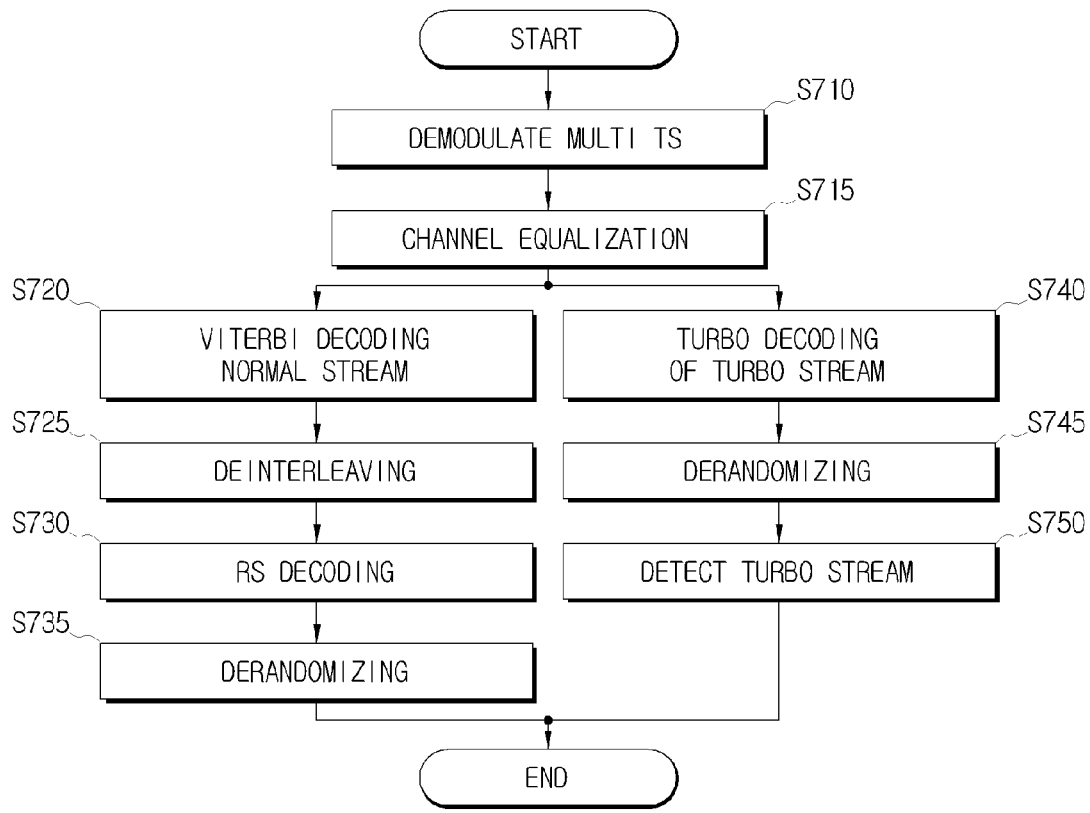
FIG. 17 is a flowchart illustrating the process of receiving multi TS according to an exemplary embodiment of the present invention.

FIG. 17 is a flowchart illustrating the process of receiving a multi TS according to an exemplary embodiment of the present invention.

Referring to FIG. 17, a multi TS is received and demodulated in operation S710. Next, the demodulated stream is equalized in operation S715.

The normal stream of the equalized stream is viterbi-decoded in operation S720, deinterleaved in operation S725, RS decoded in operation S730, and derandomized and then processed to recover the normal data in operation S735.

The turbo stream of the equalized stream is selectively decoded first in operation S740, and derandomized in operation S745. Next, the turbo stream is detected from the derandomized multi TS to recover the turbo data in operation S750.

Figure 18:
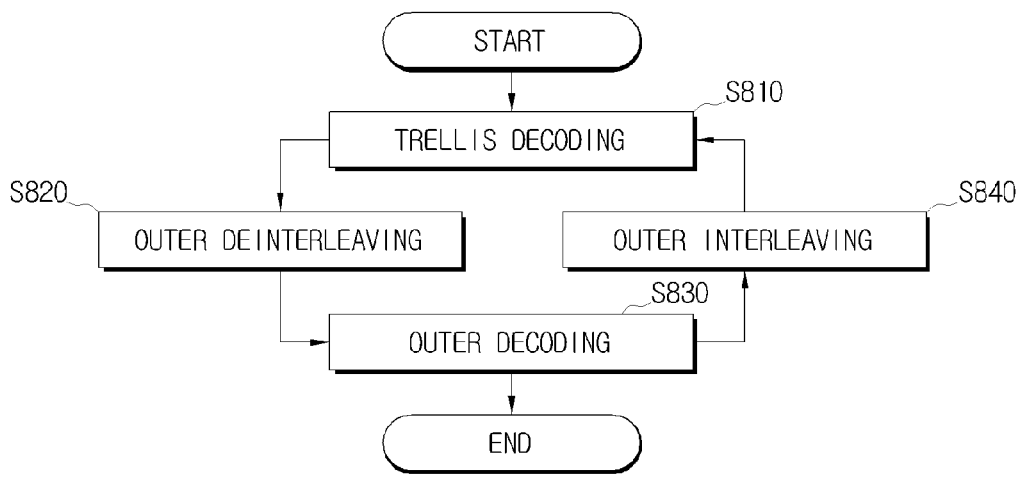
FIG. 18 is a flowchart illustrating the turbo-decoding process according to an exemplary embodiment of the present invention.

FIG. 18 is a flowchart illustrating a turbo-decoding method according to an exemplary embodiment of the present invention.

Referring to FIG. 18, a turbo stream of a multi TS is trellis-decoded in operation S810. Exclusive decoding of data of certain channel based on the coding information is possible, according to user selection.

The trellis-decoded turbo stream is outer-deinterleaved in operation S820, and outer decoding is performed in operation S830.

If a soft decision is output through the outer decoding process, the outer interleaving is performed in operation S840. The outer-interleaved turbo stream then undergoes trellis decoding, and outer deinterleaving in operations S810, S820, respectively. As a result, a reliable hard decision turbo stream can be obtained.

As explained above, according to the exemplary embodiments of the present invention, a multi TS including a mixture of a normal stream and a turbo stream having various coding rates can be transmitted and received efficiently.

In particular, by encoding and decoding the turbo stream of variable coding rate in turbo units, a turbo stream of various performances and various coding rates can be transmitted and received.

Furthermore, because a turbo stream is processed according to a user selection, power consumption of a receiving apparatus is reduced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:
1. A digital broadcast transmitting system, comprising:
a transport stream (TS) generating apparatus which generates a multi TS including at least one additional data stream processed according to a variable coding rate of the at least one additional data stream and a normal data stream; and
a transmitting apparatus which processes the multi TS, and transmits the processed multi TS via a channel.
2. The digital broadcast transmitting system as claimed in claim 1, wherein the transmitting apparatus processes the at least one additional data stream of the multi TS according to the coding rate.

3. The digital broadcast transmitting system as claimed in claim 1, wherein each of the at least one additional data stream has a different coding rate for each turbo unit.

4. The digital broadcast transmitting system as claimed in claim 3, wherein each turbo unit contains 52 packets or a multiple of 52 packets.

5. The digital broadcast transmitting system as claimed in claim 1, wherein the transmitting apparatus comprises:
   a randomizer which receives the multi TS from the TS generating apparatus and randomizes the received multi TS;
   a Reed-Solomon (RS) encoder which RS encodes the randomized multi TS;
   a data interleaver which interleaves the encoded multi TS;
   a trellis encoder which trellis encodes the outer-interleaved multi TS;
   a multiplexer (MUX) which carries out multiplexing by adding a segment synchronous signal and a field synchronous signal to the trellis-encoded multi TS; and
   a modulator which channel-modulates the multiplexed multi TS, and converts the channel-modulated multiplexed multi TS into an RF channel band signal.

6. The digital broadcast transmitting system as claimed in claim 1, wherein the variable coding rate is a rate of 1/2 or 1/4.

7. A transport stream (TS) generating apparatus, comprising:
   a Reed-Solomon (RS) encoder which RS encodes at least one additional data stream;
   a duplicator which performs coding of each of the at least one RS-encoded additional data stream according to a variable coding rate of the at least one additional data stream; and
   a multiplexer (MUX) which multiplexes the at least one additional data stream processed at the duplicator along with a normal data stream, to generate a multi TS.

8. The TS generating apparatus as claimed in claim 7, wherein each of the at least one additional data stream has a different coding rate for each turbo unit.

9. The TS generating apparatus as claimed in claim 8, wherein each turbo unit contains 52 packets or a multiple of 52 packets.

10. The TS generating apparatus as claimed in claim 7, wherein the variable coding rate is a rate of 1/2 or 1/4.

11. A transmission method of a digital broadcast transmitting system, comprising:
    generating a multi transport stream (TS) including at least one additional data stream processed according to a variable coding rate of the plurality of additional data streams and a normal data stream; and
    processing the multi TS, and transmitting the processed multi TS via a channel.

12. The transmission method as claimed in claim 11, wherein the processing comprises processing the at least one additional data stream of the multi TS according to the coding rate.

13. The transmission method as claimed in claim 11, wherein each of the at least one additional data stream has a different coding rate for each turbo unit.

14. The transmission method as claimed in claim 13, wherein each turbo unit contains 52 packets or a multiple of 52 packets.

15. The transmission method as claimed in claim 11, wherein the transmitting comprises:
    receiving the generated multi TS and randomizing the received multi TS;
    Reed-Solomon (RS) encoding the randomized multi TS;
    interleaving the encoded multi TS;
    trellis encoding the outer-interleaved multi TS;
    multiplexing by adding a segment synchronous signal and a field synchronous signal to the trellis-encoded multi TS; and
    channel-modulating the multiplexed multi TS, and converting the channel-modulated multiplexed multi TS into an RF channel band signal.

16. The transmission method as claimed in claim 11, wherein the variable coding rate is a rate of 1/2 or 1/4.

17. A transport stream (TS) generating method, comprising:
    a Reed-Solomon (RS) encoding at least one additional data stream;
    coding each of the at least one RS-encoded additional data stream according to a variable coding rate of the at least one RS-encoded additional data stream; and
    multiplexing the at least one coded additional data stream along with a normal data stream, to generate a multi TS.

18. The TS generating method as claimed in claim 17, wherein each of the at least one additional data stream has a different coding rate for each turbo unit.

19. The TS generating method as claimed in claim 18, wherein each turbo unit contains 52 packets or a multiple of 52 packets.

20. The TS generating method as claimed in claim 17, wherein the variable coding rate is a rate of 1/2 or 1/4.

* * * * *